United States Patent
Enyama et al.

(10) Patent No.: US 10,256,068 B2
(45) Date of Patent: Apr. 9, 2019

(54) CHARGED PARTICLE BEAM APPARATUS

(71) Applicant: HITACHI, LTD., Chiyoda-ku, Tokyo (JP)

(72) Inventors: Momoyo Enyama, Tokyo (JP); Yasuhiro Shirasaki, Tokyo (JP); Natsuki Tsuno, Tokyo (JP)

(73) Assignee: HITACHI, LTD., Tokyo (JP)

( * ) Notice: Subject to any disclaimer, the term of this patent is extended or adjusted under 35 U.S.C. 154(b) by 3 days.

(21) Appl. No.: 15/664,131

(22) Filed: Jul. 31, 2017

(65) Prior Publication Data

US 2018/0033587 A1    Feb. 1, 2018

(30) Foreign Application Priority Data

Aug. 1, 2016    (JP) .................. 2016-151232

(51) Int. Cl.
*H01J 37/08*      (2006.01)
*H01J 37/28*      (2006.01)

(52) U.S. Cl.
CPC .......... *H01J 37/08* (2013.01); *H01J 2237/15* (2013.01)

(58) Field of Classification Search
CPC ....................................... H01J 37/08
USPC .......... 250/396 ML, 305, 306, 307, 310, 411
See application file for complete search history.

(56) References Cited

U.S. PATENT DOCUMENTS

| | | | | |
|---|---|---|---|---|
| 6,310,341 B1* | 10/2001 | Todokoro | ................ | H01J 37/05 250/305 |
| 6,664,552 B2* | 12/2003 | Shichi | ................ | B23K 15/0006 250/307 |
| 7,244,932 B2* | 7/2007 | Nakasuji | ............... | G01N 23/225 250/306 |
| 7,728,294 B2* | 6/2010 | Hiroi | .................... | G01R 31/307 250/306 |
| 8,067,732 B2* | 11/2011 | Nakasuji | ................. | H01J 37/05 250/306 |
| 8,785,879 B1* | 7/2014 | Frosien | ................. | H01J 37/145 250/307 |
| 8,907,281 B2* | 12/2014 | Ren | ........................ | H01J 37/026 250/310 |
| 8,969,801 B2* | 3/2015 | Okai | ....................... | H01J 37/28 250/306 |
| 9,000,369 B2* | 4/2015 | Ren | ........................ | H01J 37/026 250/310 |
| 9,704,687 B2* | 7/2017 | Enyama | .............. | H01J 37/1478 |
| 2007/0181808 A1* | 8/2007 | Murakoshi | ............. | H01J 37/29 250/310 |

FOREIGN PATENT DOCUMENTS

| | | |
|---|---|---|
| JP | 4-17248 A | 1/1992 |
| JP | 11-101896 A | 4/1999 |

* cited by examiner

*Primary Examiner* — Bernard Souw

(74) *Attorney, Agent, or Firm* — Miles & Stockbridge P.C.

(57) ABSTRACT

A charged particle beam apparatus includes a charged particle source, a separator, a charged particle beam irradiation switch, and a control device. The separator is inserted into a charged particle optical system and deflects a traveling direction of a charged particle beam out of an optical axis of the charged particle optical system or deflects the traveling direction in the optical axis of the charged particle optical system. The charged particle beam irradiation switch absorbs the charged particle beam deflected out of the optical axis of the charged particle optical system or reflects the charged particle beam toward the separator. The control device controls a charged particle beam irradiation switch.

14 Claims, 11 Drawing Sheets

CHARGED PARTICLE BEAM APPARATUS

BACKGROUND OF THE INVENTION

1. Field of the Invention

The present invention relates to a charged particle beam apparatus.

2. Description of the Related Art

A charged particle beam apparatus is used for observation of a fine shape of a sample and local composition analysis. The charged particle beam apparatus irradiates the sample with a charged particle beam such as an electron beam or an ion beam and acquire signals of secondary charged particles such as generated secondary electrons. A scanning electron microscope (SEM) is used as one of such charged particle beam apparatuses. Due to high resolution thereof, for example, the SEM is used to measure a shape and size of a pattern formed in a semiconductor or magnetic disk manufacturing process and to detect a defect.

In the charged particle beam apparatus, in the case where the sample is an insulator, a surface of the sample may be charged by irradiating with a charged particle beam. In the SEM, when charging occurs, such as unexpected deflection occurs on an electron beam, and image disturbance such as image drift and image shading occurs. To perform SEM observation with high reproducibility, it is important to avoid this charging phenomenon. As a method for avoiding the charging phenomenon, a method is used in which an irradiation amount and timing of an electron beam are controlled by switching between irradiation and non-irradiation of a pulsed electron beam on a sample. For example, JP 4-17248 A discloses a method in which a pulse gate for irradiating with a pulsed electron beam is provided, and a charging phenomenon is suppressed by thinning scanning of an electron beam.

In addition, JP 11-101896 A discloses a unit including a function to repel an electron beam by applying a negative voltage higher than an acceleration voltage to an electrode of an electron beam generator and switching between irradiation and non-irradiation of the electron beam.

SUMMARY OF THE INVENTION

Most commonly, pulsing of an electron beam is realized by deflecting an electron beam on a diaphragm by using a deflector as described in JP 4-17248 A and switching between irradiation and non-irradiation of the electron beam on a sample by passing or blocking the electron beam. However, as a result of investigations by inventors of the present invention on a problem of electron beam pulse irradiation on a sample having a microscopic structure which is further required in the future, it has been found that, in this method, in a transient state switching from irradiation to non-irradiation or from non-irradiation to irradiation, an arrival position of an electron beam on the sample fluctuates, and particularly, the fluctuation of the arrival position may not be negligible since overshoot or undershoot occurs in a signal waveform due to influence of stray capacitance and inductance based on wiring, in the case of performing high-speed pulse formation. That is, since unnecessary electron beam irradiation occurs, unexpected charging and damage may occur to the sample.

In the method disclosed in JP 11-101896 A, since an electron beam is not deflected, an arrival position on a sample does not fluctuate. However, upon switching between irradiation and non-irradiation, it is necessary to apply a large voltage change corresponding to an acceleration voltage, for example, 5 kV, to an electrode. As this voltage change increases, it becomes more difficult to generate a switching signal for irradiation/non-irradiation of the electron beam, and therefore a cost of a power supply device may increase, or accuracy of a switching signal may deteriorate.

An object of the present invention is to provide a charged particle beam apparatus capable of suppressing or preventing deviation of an irradiation position of a primary charged particle beam on a sample even when high-speed pulse formation is performed.

As an embodiment to achieve the above-described object, a charged particle beam apparatus includes a charged particle source, a stage, a charged particle optical system, a separator, a charged particle beam irradiation switch, and a control device. A sample is placed on the stage. The charged particle optical system irradiates the sample with a charged particle beam generated in the charged particle source. The separator is inserted in the charged particle optical system and deflects a traveling direction of the charged particle beam out of an optical axis of the charged particle optical system or deflects the traveling direction in the optical axis of the charged particle optical system. The charged particle beam irradiation switch absorbs the charged particle beam deflected out of the optical axis of the charged particle optical system or reflects the charged particle beam toward the separator. The control device controls the charged particle beam irradiation switch. In addition, as another embodiment, a charged particle beam apparatus includes a charged particle source and a charged particle beam reflection control electrode. The charged particle beam reflection control electrode absorbs and reflects a charged particle beam generated in the charged particle source by switching an applied voltage and switches irradiation of the charged particle beam on the sample.

According to the present invention, a charged particle beam apparatus capable of suppressing or preventing deviation of an irradiation position of a primary charged particle beam on a sample can be provided even when high-speed pulse formation is performed.

DESCRIPTION OF THE PREFERRED EMBODIMENTS

Figure 1:
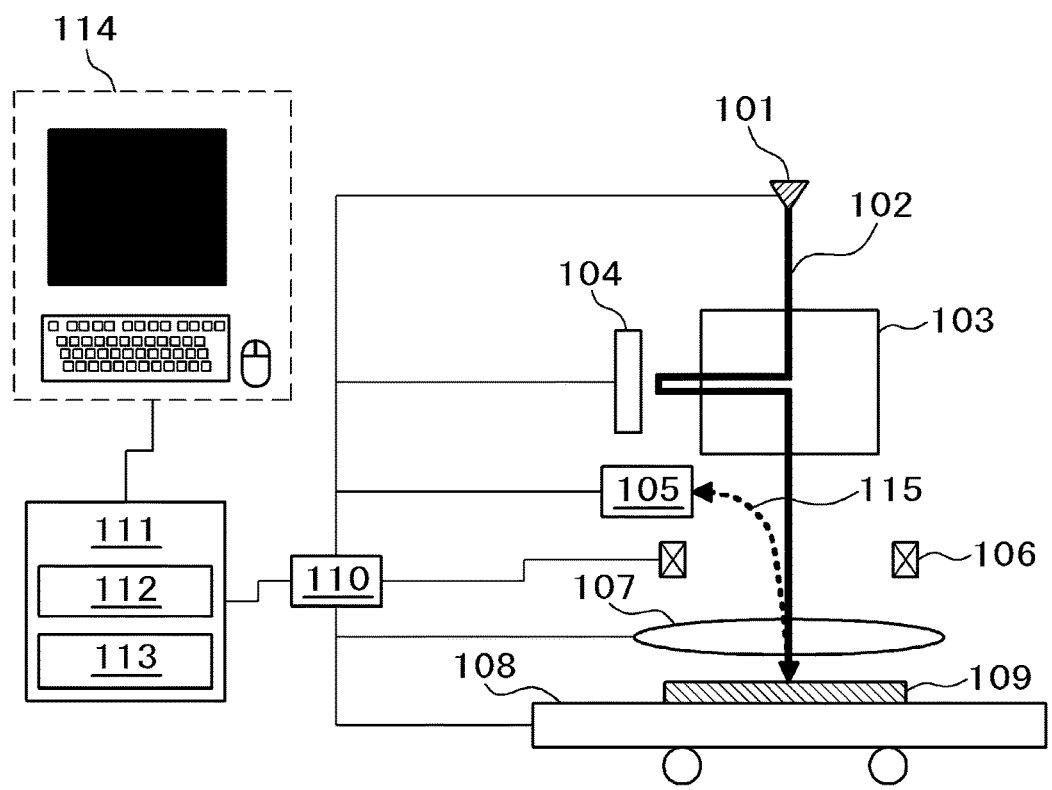
FIG. 1 is a schematic configuration diagram indicating an example of an electron beam observation apparatus according to a first example.

The inventors have examined whether irradiation and non-irradiation of an electron beam can be switched by changing a small voltage, in the configuration disclosed in JP 11-101896 A in which position deflection does not occur. As a result, the inventors have thought of using an electron beam reflection control electrode. In JP 11-101896 A, a switch is provided between a filament which emits electrons and an acceleration electrode, and therefore high voltage switching is required. On the other hand, an electron beam reflection control electrode is provided separately from the acceleration electrode, and a voltage that cancels electron energy is applied to the electron beam reflection control electrode. Consequently, the electron energy can be made zero when the voltage reaches the electron beam reflection control electrode. Therefore, an electron beam is reflected by applying a voltage obtained by superimposing a negative small voltage on a previous voltage to the electron beam reflection control electrode, and the electron beam is absorbed by applying a voltage obtained by superimposing a positive small voltage on a previous voltage to the electron beam reflection control electrode. In this case, high-speed voltage switching becomes possible only by switching over the superimposing small voltage. When a positive ion beam is used instead of an electron beam, a small voltage inverted in polarity may be superimposed. As a result of further investigation for the position to dispose the electron beam reflection control electrode, the electron beam reflection control electrode is disposed outside an optical axis (for example, a direction orthogonal to the optical axis). Therefore, an influence on an original electron optical system due to disposing a new electron beam reflection control electrode can be suppressed. The present invention is born from this new knowledge. For example, a beam separator can be used for bending an electron beam out of an optical axis.

That is, an orbit of the electron beam deflects out of the optical axis by the beam separator in the middle of an optical system and enters toward the electron beam reflection control electrode. The orbit of the electron beam is reversed by this electron beam reflection control electrode and incident on the beam separator again. On general conditions for irradiating a sample with an electron beam, the electrode reflects the electron beam, and when the electron beam is not irradiated, the electrode absorbs the electron beam. As a result, high-speed and high-precision electron beam irradiation and non-irradiation can be switched, and highly sensitive and highly efficient inspection and measurement techniques can be realized without position deviation of the electron beam on the sample.

Hereinafter, the present invention will be described in detail with reference to the accompanying drawings. In every drawing for describing the examples, same elements are denoted by the same reference signs, and redundant descriptions thereof are omitted. An example of an observation apparatus for a sample using an electron beam will be described below. However, effects of the present invention are not lost even when an ion beam is used.

EXAMPLE 1

An electron beam observation apparatus according to a first example of the present invention will be described.

FIG. 1 is a schematic configuration diagram indicating an example of an electron beam observation apparatus according to the first example.

First, a device configuration will be described. An electron beam 102 is extracted from an electron source 101. In a downstream direction, a beam separator 103, an electron beam irradiation switch 104, a detector 105, a scanning deflection deflector 106, and an objective lens 107 are disposed. In addition, an aligner for adjusting the center axis (optical axis) of a primary beam, an aberration corrector (not illustrated) and the like are also added to an electron optical system. Although an example in which the objective lens 107 according to the example is an electromagnetic lens which controls focus by excitation current is described, the objective lens 107 may be an electrostatic lens or a combination of an electromagnetic lens and an electrostatic lens.

A stage 108 can move in a state in which a sample 109 is placed thereon. A control device 110 is connected to each of the electron source 101, the beam separator 103, the electron beam irradiation switch 104, the detector 105, the scanning deflection deflector 106, the objective lens 107, and the stage 108 and is further connected to a system controller 111.

The system controller 111 functionally includes a storage device 112 and a computing unit 113, and an input/output unit 114 including an image display device is connected. Although not illustrated, components other than a control system and a circuit system are disposed in a vacuum container, and it goes without saying that the components are operated in a vacuum. In addition, it goes without saying that a sample conveyance system for disposing a sample on the stage from outside the vacuum is provided.

More specifically, the system controller 111 includes a central processing unit which is the computing unit 113 and a storage unit which is the storage device 112. By executing a program stored in the storage device 112 and the like by using the central processing unit as the above-described computing unit 113, for example, image processing related to a defect inspection and a dimension measurement or control such as the control device 110 can be performed. In the present description, the system controller 111, the input/output unit 114, the control device 110 and the like are also included and collectively called a controller in some cases. Further, the input/output unit 114 may include an input unit such as a keyboard and a mouse and a display unit such as a liquid crystal display device separately as an input unit and an output unit, or may include an integrated input/output unit using such as a touch panel.

Next, image observation performed by using the apparatus according to the example will be described. The electron beam irradiation switch 104 is an element to switch between irradiation and non-irradiation of an electron beam on a sample, and in the present description, the case where a sample is irradiated with an electron beam is described. A method for switching between irradiation and non-irradiation (electron beam pulsing method) will be described later.

The electron beam 102 emitted from the electron source 101 passes through the beam separator 103 and is emitted toward the electron beam irradiation switch 104. An orbit direction of the electron beam 102 is reversed by the electron beam irradiation switch 104, and the electron beam 102 reenters the beam separator 103 and enters the objective lens 107. Focus of the electron beam 102 is controlled by the objective lens 107, and the electron beam 102 is focused on the sample 109 such that a beam diameter is minimized. The scanning deflection deflector 106 is controlled by the control device 110 such that the electron beam 102 scans a predetermined region of the sample 109.

The electron beam 102 reaching a surface of the sample 109 interacts with a substance near the surface. As a result, secondary electrons such as reflected electrons, secondary electrons and Auger electrons are generated from the sample and become signals to be acquired. In this example, the case where the signals are secondary electrons will be described.

Secondary electrons 115 generated from the position where the electron beam 102 reaches the sample 109 is detected by the detector 105. Signal processing of the secondary electrons 115 detected by the detector 105 is performed in synchronization with a scan signal sent from the control device 110 to the scanning deflection deflector 106. Consequently, an SEM image is formed, and observation of the sample 109 is performed.

In the present example, the detector 105 is disposed upstream of the objective lens 107 and the scanning deflection deflector 106. However, the order of arrangement may be changed. Although not illustrated, an aligner for correcting an optical axis of an electron beam is disposed between the electron source 101 and the objective lens 107, and the optical axis can be corrected when the center axis of the electron beam is shifted with respect to a diaphragm or an electron optical system. In FIG. 1, a traveling direction of the electron beam 102 and the secondary electrons 115 are indicated by arrows.

In the present example, a magnetic field sector is used for the beam separator 103. However, the example may be realized by combining a plurality of EXBs or electrostatic deflectors.

Figure 2A:
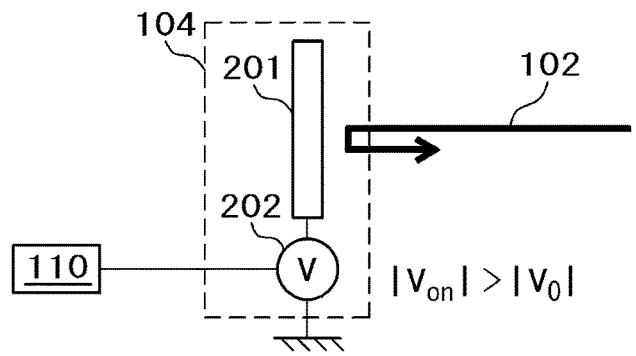
FIG. 2A is a side surface view for describing an operation (pulse ON) of an electron beam irradiation switch in the electron beam observation apparatus illustrated in FIG. 1.
Figure 2B:
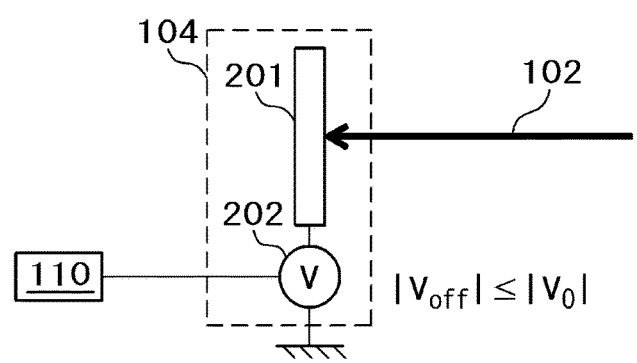
FIG. 2B is a side surface view for describing an operation (pulse OFF) of the electron beam irradiation switch in the electron beam observation apparatus illustrated in FIG. 1.

Next, a method for switching between irradiation and non-irradiation of the electron beam 102 on the sample 109 according to the example will be described. FIGS. 2A and 2B are side surface views for describing an operation of the electron beam irradiation switch illustrated in FIG. 1. In the present example, the electron beam irradiation switch 104 includes an electron beam reflection control electrode 201 and an electron beam reflection control power source 202. The electron beam reflection control power source 202 is a voltage source controlled by the control device 110 to apply a voltage generated from the electron beam reflection control power source 202 to the electron beam reflection control electrode 201. A shape of the electron beam reflection control electrode is not limited. However, a circle is preferable in view of an electric field.

First, the case of irradiating a sample with an electron beam will be described with reference to FIG. 2A. In the case of irradiating the sample with the electron beam 102, an orbit of the electron beam 102 is reversed by the electron beam irradiation switch 104. In the case where an acceleration voltage of the electron beam 102 accelerated by an acceleration electrode (not illustrated) is $V_0$, to reverse a traveling direction of an orbit of the electron beam 102, the electron beam reflection control power source 202 is controlled such that a voltage $V_{on}$ applied to the electron beam reflection control electrode 201 satisfies the following formulas (1) and (2).

[Mathematical Formula 1]

$$|V_{on}| > |V_0| \tag{1}$$

[Mathematical Formula 2]

$$V_{on} < 0 \tag{2}$$

Since a negative voltage is applied to the electron beam reflection control electrode 201, the electron beam 102 gradually decreases from the acceleration voltage $V_0$ in the vicinity of the electron beam reflection control electrode 201 and decelerates. After the acceleration voltage becomes zero, that is, after a speed becomes zero, a traveling direction of the electron beam 102 is reversed, and the electron beam travels in an opposite direction. When the electron beam 102 sufficiently separates from the electron beam reflection control electrode 201, the acceleration voltage of the electron beam 102 becomes $V_0$. In this manner, the electron beam 102 reverses a traveling direction of the orbit while maintaining the acceleration voltage. As illustrated in FIG. 1, then, the electron beam 102 enters the beam separator 103, emits toward the objective lens 107, and irradiates the sample 109.

Next, with reference to FIG. 2B, the case of non-irradiation in which the electron beam does not irradiate the sample will be described. In the case of non-irradiation, a voltage $V_{off}$ generated from the electron beam reflection control power source 202 and applied to the electron beam reflection control electrode 201 is controlled so as to satisfy the following formula (3).

[Mathematical Formula 3]

$$|V_{off}| \le |V_0| \tag{3}$$

When the voltage $V_{off}$ satisfies the formula (3), an acceleration voltage of the electron beam 102 does not become zero. Therefore a traveling direction of an orbit of the electron beam 102 is not reversed, and the electron beam 102 collides with and is absorbed by the electron beam reflection control electrode 201. Therefore, the electron beam 102 does not irradiate the sample 109.

Figure 2C:
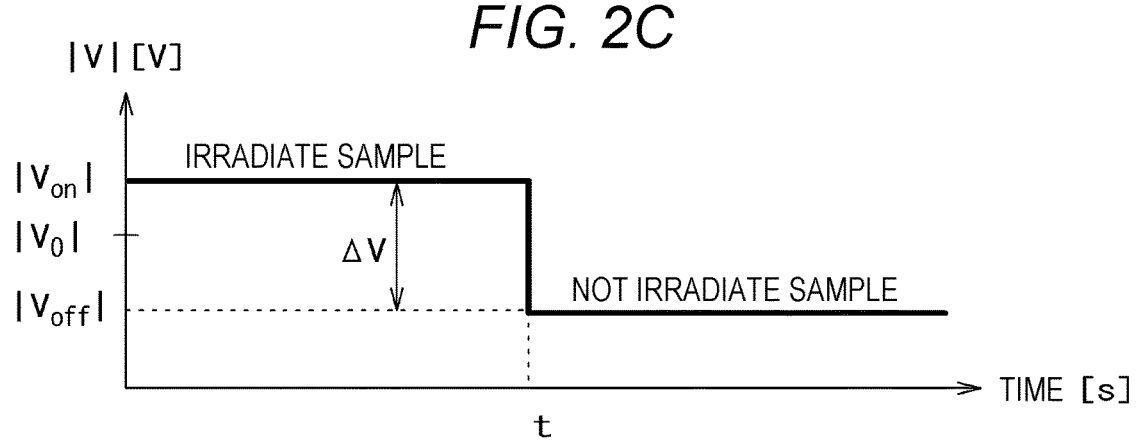
FIG. 2C is a signal waveform diagram indicating an example of a control signal of the electron beam reflection control power source connected to an electron beam reflection control electrode of the electron beam irradiation switch in the electron beam observation apparatus illustrated in FIG. 1.

FIG. 2C is a signal waveform diagram indicating an example of a control signal of the electron beam reflection control power source 202 in the case where the electron beam irradiation switch 104 is switched from an irradiation condition to a non-irradiation condition at a time t. In FIG. 2C, V<0 is established at all voltages V. According to the formulas (1) and (3), $|V_{on}|$ is set higher than $|V_0|$, and $|V_{off}|$ is set lower than $|V_0|$.

In switching between irradiation and non-irradiation, the control signal needs a voltage change by $\Delta V$ which is a difference between $V_{on}$ and $V_{off}$. Here, when the control signal is switched at high speed, ringing may occur in a waveform due to the influence of stray capacitance and inductance based on wiring from the electron beam reflection control power source 202 to the electron beam reflection control electrode 201.

In this case, an ideal waveform as illustrated in FIG. 2C is not obtained, and overshoot or undershoot occurs. Desirably, the overshoot or undershoot amplitude of this voltage is small. Since this amplitude increases as $\Delta V$ increases, a small value is preferably set as $\Delta V$. On the other hand, when the value $V_{off}$ is close to $V_0$, an acceleration voltage when the electron beam 102 collides with the electron beam reflection control electrode 201 is as low as, for example, approximately 100 V, and noise may be caused since a yield of reflected electrons increases. Considering the above-described two points, it has been found that a condition of the following formula (4) is preferable as $\Delta V$.

[Mathematical Formula 4]

$$\Delta V \leq 500 \text{ [V]} \quad (4)$$

This value is equal to or less than 1/10 of the voltage required for the configuration of JP 11-101896 A and can be switched at high speed. As described above, by combining the beam separator and the electron beam reflection control electrode, irradiation and non-irradiation of an electron beam can be switched at high speed.

In the method according to this example, irradiation and non-irradiation of an electron beam are switched by a voltage applied to the electron beam reflection control electrode 201. Therefore a position of the electron beam does not move in a transient state of the switching. In addition, the electron beam reflection control electrode 201 changes a lens action on the electron beam 102 according to an applied voltage. Therefore, in the transient state of switching between irradiation and non-irradiation of an electron beam, focus on a sample slightly deviates.

As a method for reducing this effect, it is effective to form crossover of the electron beam 102 at the center of the above-described lens, that is, in the vicinity of the electron beam reflection control electrode 201. Further, a method is effective in which, by making a rear stage (only the objective lens in this example) of the electron beam reflection control electrode be a sufficiently small reduction ratio, for example a magnification of 1/20 or less, fluctuation of the focus is reduced in comparison with a focal depth.

In this example, all the settings of an optical system, such as adjustment of an optical axis of an objective lens, are separately set, and an example in which an operator directly sets is not indicated. However, the operator may set before such as observation of a sample, or the setting may be automatically set and determined by a method such as feeding back to a control system based on an image.

Next, an example of observation of a sample will be described.

Figure 8A:
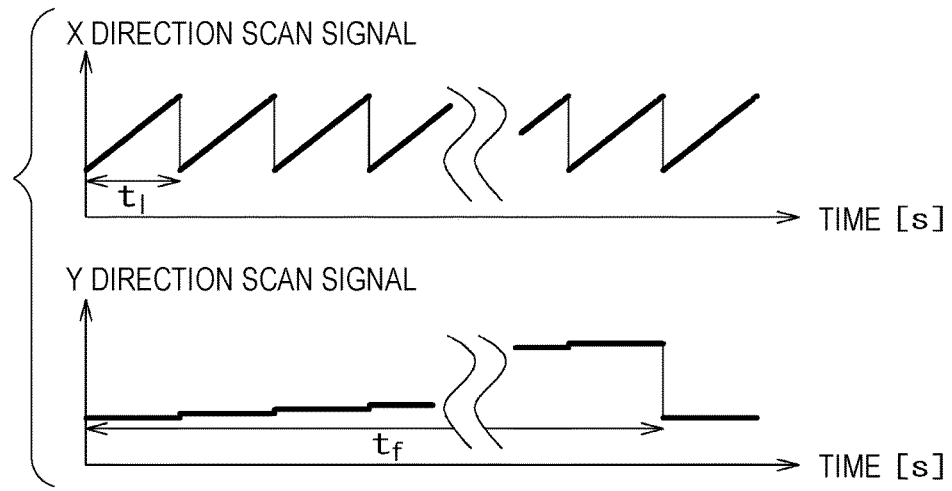
FIG. 8A is a signal waveform diagram indicating an example of a control signal to a scanning deflector of the electron beam observation apparatus according to the first example. The upper diagram indicates an X direction, and the lower diagram indicates a Y direction.

FIG. 8A is a signal waveform diagram indicating an example of a scan signal (control signal) sent from the control device 110 to the scanning deflection deflector 106 when an SEM image is formed. The upper drawing indicates an X direction, and the lower drawing indicates a Y direction. The most common scan signal is a signal called a raster scan. The raster scan provides a ramp signal each in the X direction and the Y direction.

Figure 8B:
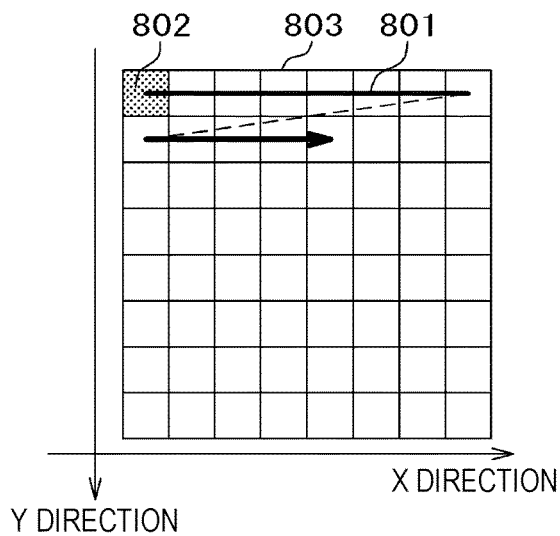
FIG. 8B is a diagram indicating an example of beam scanning by the scanning deflector of the electron beam observation apparatus according to the first example.

FIG. 8B indicates a state of electron beam scanning in a sample in the case where the scan signal in FIG. 8A is sent to the scanning deflection deflector 106. The electron beam is scanned by changing a position thereof in accordance with a scanning orbit 801. First, after the electron beam deflects in the X direction, and scanning of one line is completed during the time $t_1$, an operation moving in the Y direction by one pixel and scanning again in the X direction is repeated, and during a time $t_f$, one frame image is acquired. A reference sign 802 denotes one pixel, and information of secondary electrons for each pixel is detected by the detector 105 in synchronization with scanning. A reference sign 803 denotes a field of view, and an area of the field of view 803 is determined in proportion to an amplitude of a signal in the X direction and the Y direction in FIG. 8A.

In the case of acquiring a normal SEM image in which an electron beam is not pulsed, pixel information is sequentially acquired in the entire scan signal area in FIG. 8A or in the entire field of view in FIG. 8B. However, when a sample is an insulator, depending on optical conditions, the sample is charged, and image defects occur. To avoid this influence, in the present example, by controlling the electron beam irradiation switch 104 by the control device 110, switching between irradiation and non-irradiation of the electron beam on the sample is repeated, SEM images are acquired while suppressing the influence of charging.

Figure 8C:
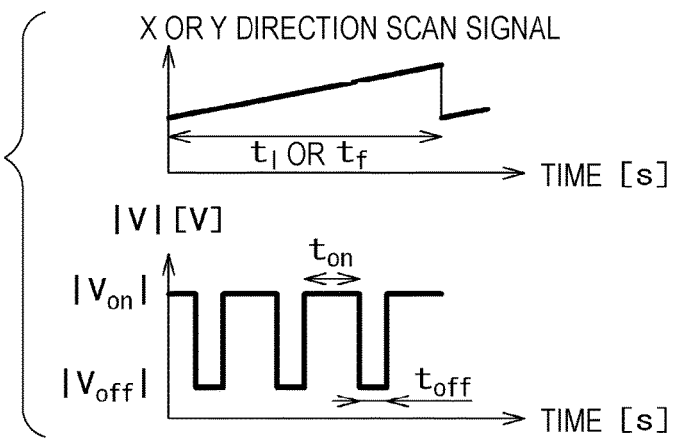
FIG. 8C is a signal waveform diagram indicating an example of a control signal to the scanning deflector and the electron beam irradiation switch of the electron beam observation apparatus according to the first example. The upper diagram indicates a scanning deflector, and the lower diagram indicates the electron beam irradiation switch.

FIG. 8C indicates a control signal of the electron beam irradiation switch 104 together with a scan signal. The upper diagram is the scan signal, and the lower diagram is the control signal of the electron beam irradiation switch 104. The electron beam irradiation switch 104 repeatedly switches the irradiation time $t_{on}$ and the non-irradiation time $t_{off}$ of the electron beam on the sample. In this example, a switching timing is during a period shorter than one cycle ($t_1$ or $t_f$) of a ramp waveform of a scan signal in the X direction or the Y direction, and scanning of the electron beam on the sample is thinning scanning. A ratio between the scanning time $t_1$ and $t_f$ of this raster scan and the irradiation/non-irradiation time $t_{on}/t_{off}$ of the electron beam on the sample can be appropriately selected according to an optical condition for observation, such as a sample material, an accelerating voltage, a probe current, an electric field strength directly above a sample, a scanning speed, and an observation magnification.

Figure 9:
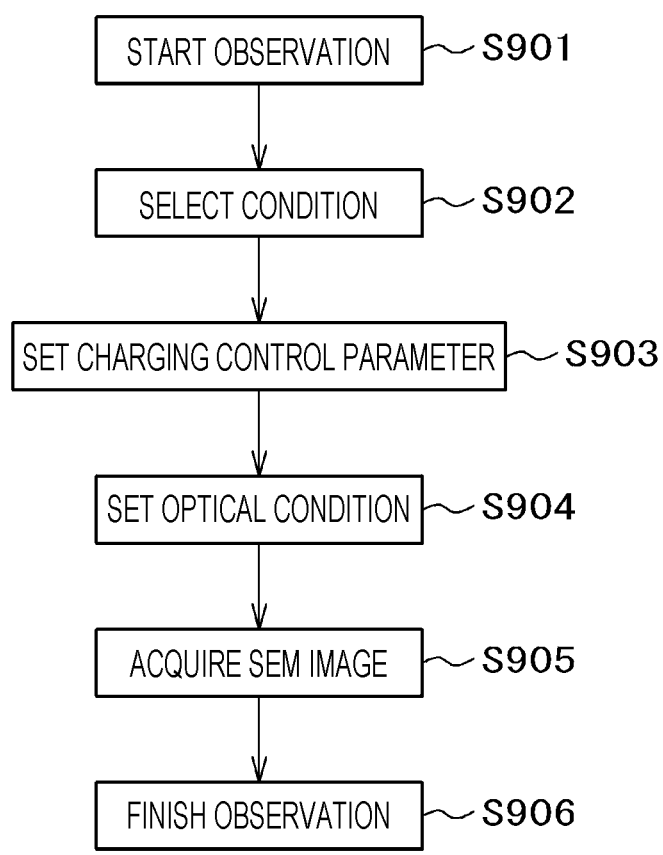
FIG. 9 is a flowchart of image observation using the electron beam observation apparatus according to the first example.
Figure 10:
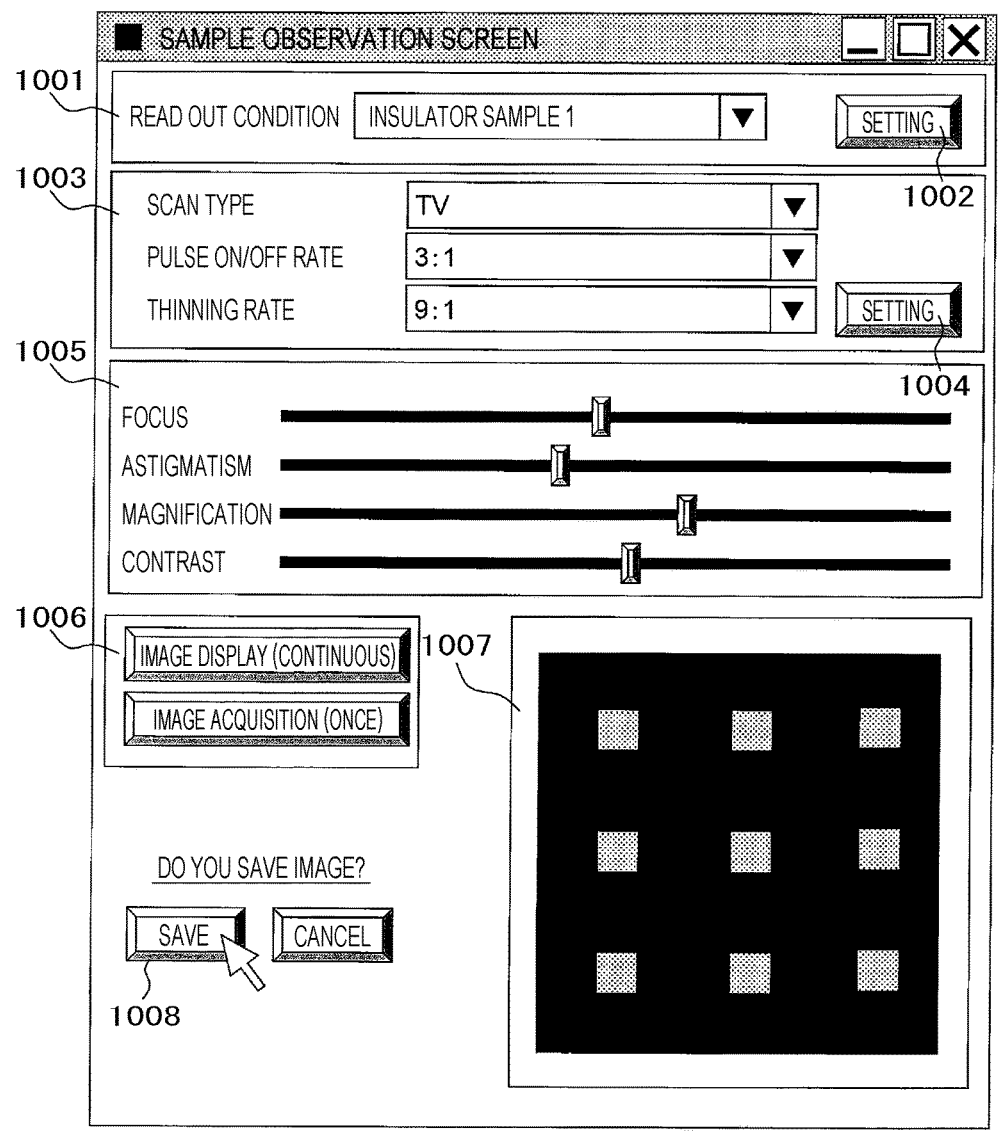
FIG. 10 is an image observation screen in the electron beam observation apparatus according to the first example.

With reference to FIGS. 9 and 10, a method for observing a sample made of an insulator will be described by using the configuration of the present example. FIG. 9 is a flowchart for observing a sample without being affected by charging by using this example. An operator starts observation via the input/output unit 114 including an image display device (step S901 in FIG. 9). The image display apparatus indicates, for example, an optical axis adjustment screen of the electron beam irradiation switch illustrated in FIG. 10. Hereinafter, FIG. 10 is referred unless otherwise noted.

An operator selects a condition file previously determined in a reading condition setting unit 1001 and stored in the storage device 112 and presses a setting button 1002 to read desired observation conditions and optical conditions (step S902). The read out condition is a condition stored in advance according to the above-described optical conditions for observation, such as a sample material, an acceleration voltage, a probe current, electric field intensity directly above a sample, a scanning speed, and an observation magnification.

When the condition is selected, a control signal is sent from the system controller 111 to an apparatus via the control device 110, and desired optical conditions are set. After various conditions are set, a relation between the scanning time $t_1$ and $t_f$ of raster scan and the irradiation/non-irradiation time $t_{on}/t_{off}$ of an electron beam on a sample is displayed on a charging control setting unit 1003 according to the read out condition.

In the present example, the scanning time $t_1$ and $t_f$ of raster scan is set by selecting a scanning type, a ratio of the irradiation/non-irradiation time $t_{on}/t_{off}$ is set by selecting an ON/OFF pulse rate, and a ratio between $t_1$ and $t_{on}$ can be set by selecting a thinning rate.

Here, an operator sets each parameter in the charging control setting unit to a desired value and presses a setting button 1004 (step S903). Further, if necessary, the operator sets various optical conditions such as focus, astigmatism, and magnification displayed in an optical condition setting unit 1005 (step S904).

When the operator presses any one of image acquisition buttons 1006, an SEM image is displayed on a screen 1007 (image acquisition) (step S905). The operator presses an image storage button 1008 to store the SEM image and completes a flow of image acquisition (end of observation) (step S906).

In the present example, an example has been described in which the scanning deflection deflector performs raster scanning. However, vector scanning that appropriately changes a scanning direction can also be applied. In this manner, it is possible to determine a pulse condition for suppressing charging according to a sample material, and observation can be performed under other conditions.

Next, an example of effectively utilizing a change in a signal amount generated by charging of a sample will be described.

Figure 11:
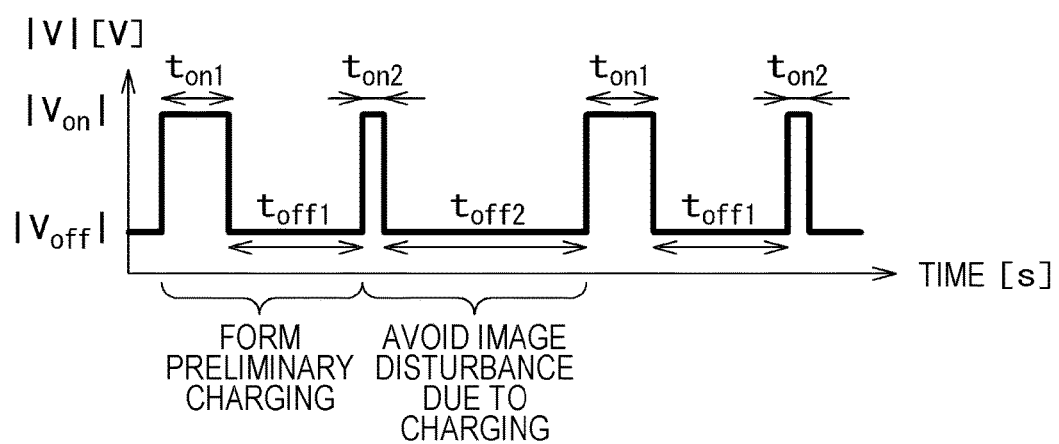
FIG. 11 is a signal waveform diagram indicating another example of a control signal to the electron beam irradiation switch in the electron beam observation apparatus according to the first example.

FIG. 11 indicates another example of a control signal of the electron beam irradiation switch 104 according to the present example. In the present example, switching is repeated in the order of time $t_{on1}$, $t_{off1}$, $t_{on2}$, $t_{off2}$, like irradiation, non-irradiation, irradiation, non-irradiation of an electron beam on a sample. That is, in FIG. 8C, each of an irradiation time and a non-irradiation time is one type. However, FIG. 11 indicates two types. Among them, in the time $t_{on1}$ and $t_{off1}$, preliminary irradiation of an electron beam is performed to a sample, and a contrast of an acquired image is enhanced by forming charging in advance before observation. The times $t_{on2}$ and $t_{off2}$ are used to avoid occurrence of image disturbance due to charging by continuously controlling such that the electron beam does not reach the sample. In this manner, by controlling signal waveforms of irradiation and non-irradiation, observation compatible with charge control and charge suppression can be performed.

As an electron beam irradiation switch in the electron beam observation apparatus illustrated in FIG. 1, when a pulse having a pulse width of nanosecond to picosecond is formed as a primary electron beam by using the electron beam irradiation switch illustrated in FIGS. 2A and 2B and irradiates a sample, the influence of charging is reduced, and deviation of an irradiation position of the primary electron beam on the sample is suppressed or prevented. Consequently highly sensitive and highly efficient inspection and measurement can be performed.

According to the above-described example, a charged particle beam apparatus capable of suppressing or preventing deviation of an irradiation position of a primary charged particle beam on a sample can be provided even when high-speed pulse formation is performed.

EXAMPLE 2

Next, a second example of the present invention will be described. Matters described in Example 1 and not described in the present example can also be applied to the present example unless there are special circumstances.

In this example, an optical axis of an electron beam irradiation switch 104 can be easily adjusted, and therefore an example will be described in which a configuration capable of detecting an electron beam is added. Since other device configurations are the same as the configuration according to Example 1, description will be omitted in this example.

Figure 3A:
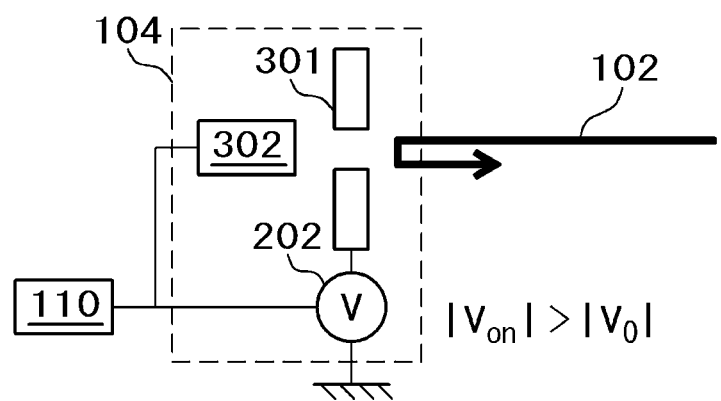
FIG. 3A is a side surface view for describing an operation (pulse ON) of an electron beam irradiation switch in an electron beam observation apparatus according to a second example.
Figure 3B:
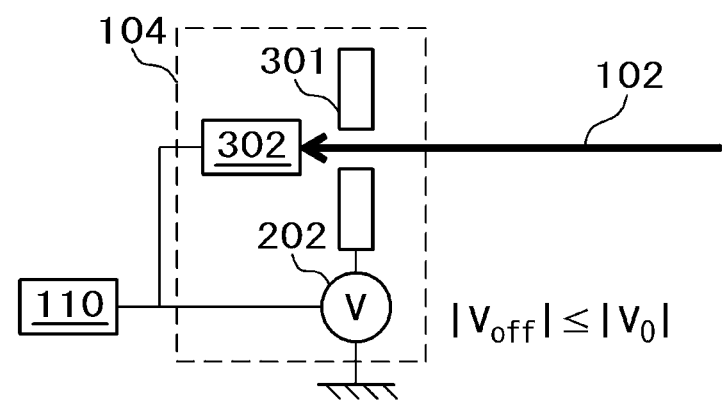
FIG. 3B is a side surface view for describing an operation (pulse OFF) of the electron beam irradiation switch illustrated in FIG. 3A.

FIGS. 3A and 3B are side surface views for describing an operation of an electron beam irradiation switch. As with FIGS. 2A and 2B, each of FIGS. 3A and 3B corresponds to conditions under which an electron beam irradiates and does not irradiate a sample. A configuration of the electron beam irradiation switch 104 according to this example is different from the configuration of the example illustrated in FIGS. 2A and 2B in terms of including an opening in the vicinity of the center of an electron beam reflection control electrode 301 and including a detector 302 behind the opening. In addition, the detector 302 is connected to a control device 110. Configurations other than the above are the same as in Example 1. A shape of the opening of the electron beam reflection control electrode is not limited. However, a circle is preferable in view of an electric field.

An irradiation condition of an electron beam to a sample is the same as in the Example 1 and realized by the formulas (1) and (2). Even if the electron beam reflection control electrode 301 includes an opening, it is possible to reverse a traveling direction of an orbit of an electron beam 102. A non-irradiation condition of the electron beam is also the same as in the Example 1 and realized by the formula (3). Further, a condition for switching between irradiation and non-irradiation follows the formula (4).

Here, as illustrated in FIG. 3B, an opening is provided near the center of the electron beam reflection control electrode 301 in the case of non-irradiation. Therefore, the electron beam 102 does not collide with the electron beam reflection control electrode 301 and enters the detector 302 located behind the electron beam reflection control electrode 301. By confirming this signal, it is possible to adjust the electron beam 102 so as to pass through an axis of the electron beam irradiation switch 104.

Further, according to the present example, the detector 302 is not connected to an electron beam reflection control power source 202 and applies a positive bias voltage (not illustrated) for amplifying a detection signal. When the applied voltage is, for example, 5 kV, an acceleration voltage of the electron beam 102 at the time of reaching the detector can be set to a high value of |V0|+5 kV, and generation of reflected electrons which has been a problem in Example 1 can be suppressed.

Figure 4:
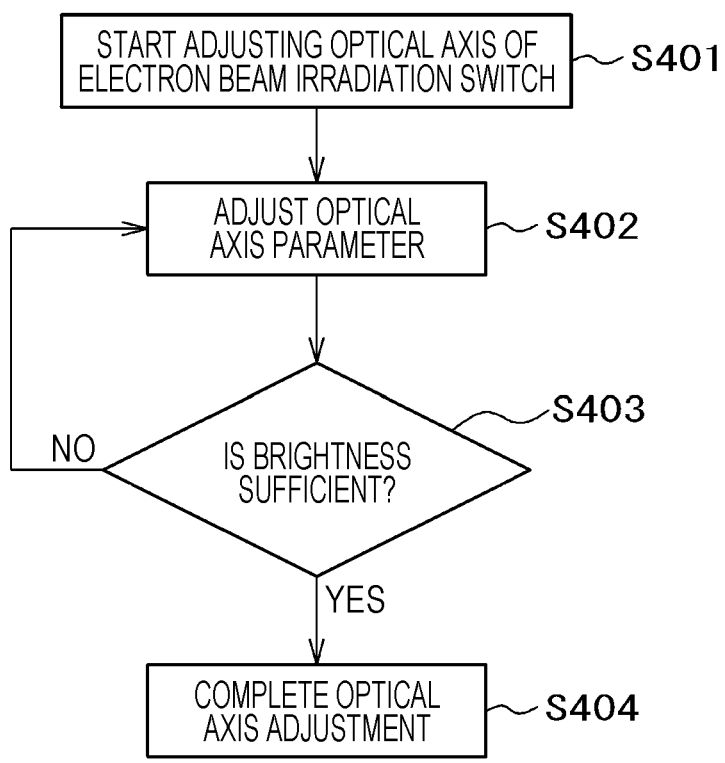
FIG. 4 is a flowchart for adjusting an optical axis of the electron beam irradiation switch in the electron beam observation apparatus according to the second example.
Figure 5:
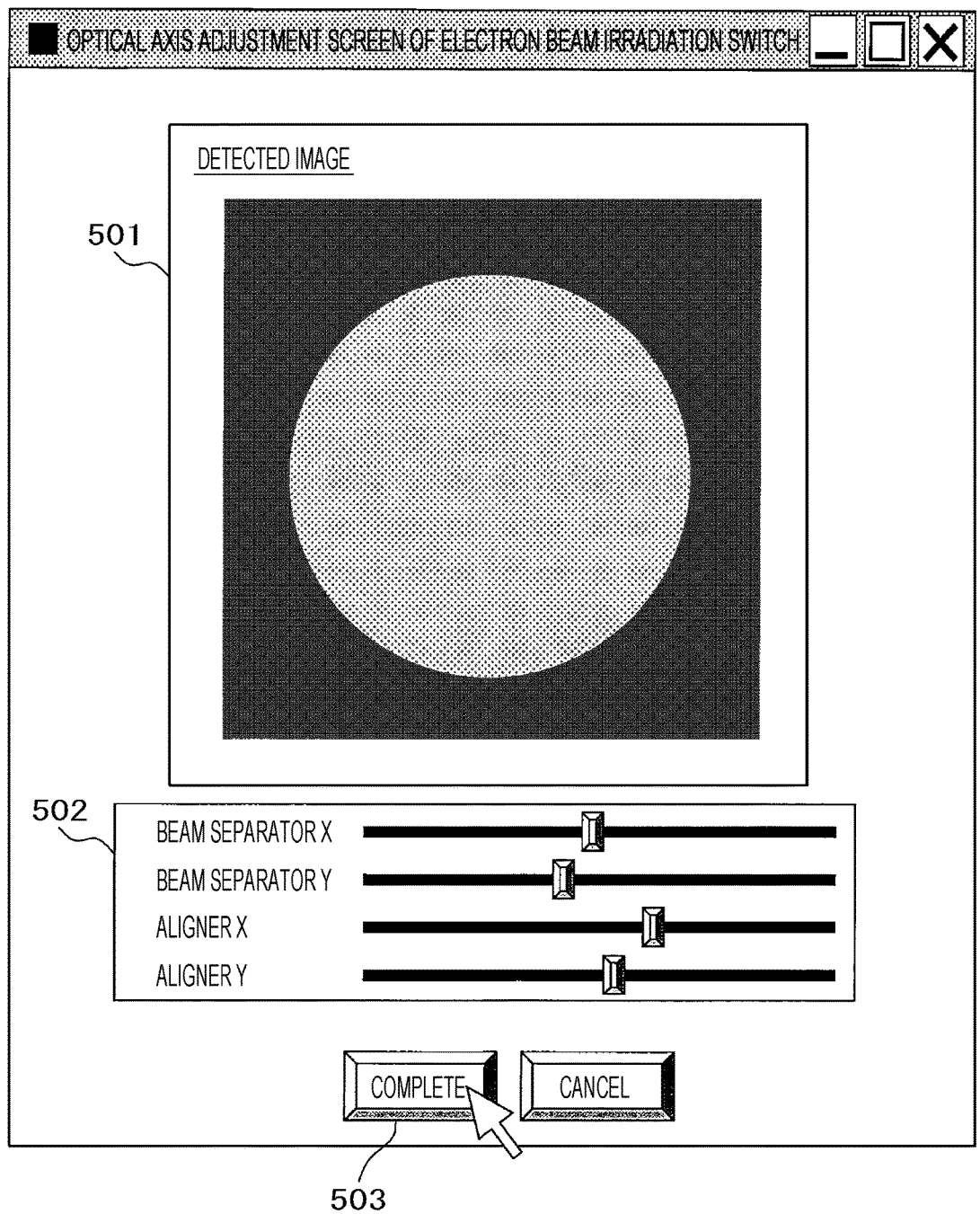
FIG. 5 is an example of an optical axis adjustment screen of the electron beam irradiation switch in the electron beam observation apparatus according to the second example.

Subsequently, by using a configuration in the present example, a method for adjusting an optical axis of the electron beam irradiation switch 104 will be described with reference to FIGS. 4 and 5. FIG. 4 is a flowchart for adjusting an optical axis of the electron beam irradiation switch 104. An operator starts adjusting an optical axis of the electron beam irradiation switch 104 via an input/output unit 114 including an image display device (step S401 in FIG. 4). The image display apparatus indicates an optical axis adjustment screen of the electron beam irradiation switch 104 illustrated in FIG. 5. Hereinafter, FIG. 5 is referred unless otherwise noted.

When optical axis adjustment is started, a scan signal is sent to a deflector and an aligner (not illustrated) disposed on an upstream side of the electron beam irradiation switch 104, and the electron beam 102 is scanned on the detector 302. A detected image 501 obtained in this manner is displayed on the optical axis adjustment screen. Since a signal is not acquired when the detected image 501 is scanned outward from a detection surface on which the electron beam 102 can be detected, the detected image 501 is observed as an image having a shape corresponding to the detection surface of the detector. A mesh, a diaphragm or the like may be disposed on a front stage of the detector 302, and a transmission image based on the shape thereof may be acquired.

An operator adjusts a slide bar of an optical axis adjuster 502 such that brightness of the detected image 501 and blurring of an edge are optimized (step S402). In the present example, an optimum state is a condition that the center of the detected image 501 becomes the brightest. The operator determines whether the brightness of the detected image 501 is sufficient (step S403). If the brightness is sufficient, the operator presses a complete button 503, the condition is saved in a storage device 112, and the optical axis adjustment is completed (step S404).

In the present example, the determination in step S403 is performed based on the brightness of the detected image 501. However, if blurring of an edge portion of the detected image 501 or a mesh or diaphragm is disposed in front of the detector 302, the determination may be performed by sharpness of the transmission image.

In the present example, an example is described in which the optical axis adjuster 502 adjusts a beam separator 103 and an aligner (not illustrated) in step S402. However the adjustment may be performed by an optical element such as a lens, a deflector, and an astigmatism corrector other than the above.

Further, in the present example, an example is described in which an operator manually adjusts the optical axis adjuster 502. However, steps S402 to S403 may be automatically performed by storing a detected image in the middle of adjustment in the storage device 112, numerically converting a change in the image due to a change in an optical axis parameter by a computing unit 113, and calculating and feeding back an optimum value. The optical axis adjustment screen of the electron beam irradiation switch illustrated in FIG. 5 is just an example, and needless to say that other screen configurations may be adopted.

As a result, irradiation and non-irradiation of an electron beam can be switched, and an optical axis of the electron beam irradiation switch 104 which realizes the switching can be adjusted.

As an electron beam irradiation switch in the electron beam observation apparatus illustrated in FIG. 1, when a pulse having a pulse width of nanosecond to picosecond is formed as a primary electron beam by using the electron beam irradiation switch illustrated in FIGS. 3A and 3B and irradiates a sample, the influence of charging is reduced, and deviation of an irradiation position of the primary electron beam on the sample is suppressed or prevented. Consequently highly sensitive and highly efficient inspection and measurement can be performed.

According to the present example, the same effects as in Example 1 can be obtained. Further, by using the electron beam reflection control electrode 301 including an opening and the detector 302 as an electron beam irradiation switch, an optical axis of the electron beam irradiation switch 104 can be easily adjusted. Further, it is possible to suppress generation of secondary electrons or reflected electrons during non-irradiation.

EXAMPLE 3

Next, a third example of the present invention will be described. Matters described in Example 1 or 2 and not described in the present example can also be applied to the present example unless there are special circumstances.

In the present example, an example will be described in which a Faraday cup is added for measuring a probe current of an electron beam 102. Since other device configurations are the same as the configuration according to Example 1, description will be omitted in this example.

Figure 6A:
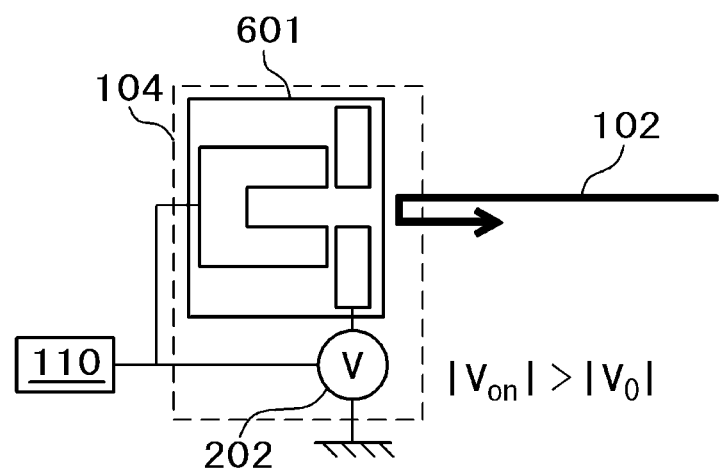
FIG. 6A is a side surface view for describing an operation (pulse ON) of an electron beam irradiation switch in an electron beam observation apparatus according to a third example.
Figure 6B:
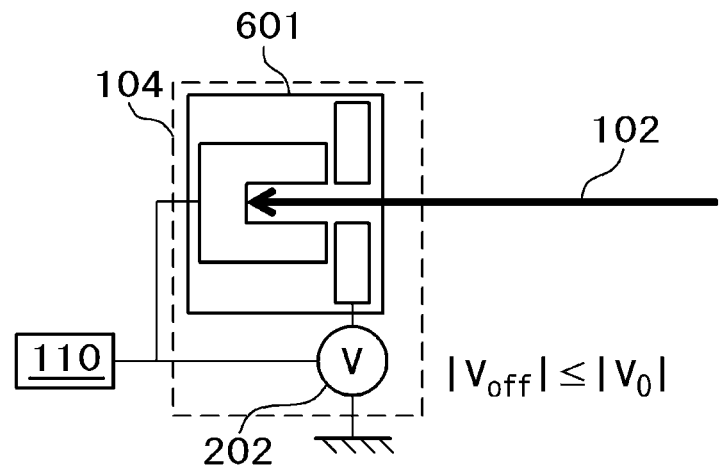
FIG. 6B is a side surface view for describing an operation (pulse OFF) of the electron beam irradiation switch illustrated in FIG. 6A.

FIGS. 6A and 6B are side surface views for describing an operation of an electron beam irradiation switch. As with FIGS. 2A and 2B and FIGS. 3A and 3B, each of FIGS. 6A and 6B corresponds to conditions under which an electron beam irradiates and does not irradiate a sample. A configuration of the electron beam irradiation switch according to the present example is different from the configurations of the example illustrated in FIGS. 3A and 3B in that an electron beam reflection control electrode 601 has a Faraday cup structure. As a result, under the non-irradiation condition, when the electron beam 102 reaches the electron beam reflection control electrode 601, it is difficult to release generated secondary electrons and reflected electrons outward of a Faraday cup. Therefore, it is avoidable that the generated reflected electrons reach a sample and becomes noise.

In addition, the electron beam reflection control electrode 601 is connected to a control device 110, and therefore can measure a probe current of the electron beam 102 which has reached the Faraday cup, display the current on an input/output unit 114, and store the current in the storage device 112. Configurations other than the above are the same as in Example 1.

Further, if the current which has reached the Faraday cup is imaged, it is possible to use the method for adjusting an optical axis of the electron beam irradiation switch 104 indicated in Example 2.

As a result, irradiation and non-irradiation of an electron beam can be switched, and an optical axis of the electron beam irradiation switch 104 which realizes the switching can be adjusted.

As an electron beam irradiation switch in the electron beam observation apparatus illustrated in FIG. 1, when a pulse having a pulse width of nanosecond to picosecond is formed as a primary electron beam by using the electron beam irradiation switch illustrated in FIGS. 6A and 6B and irradiates a sample, the influence of charging is reduced, and deviation of an irradiation position of the primary electron beam on the sample is suppressed or prevented. Consequently highly sensitive and highly efficient inspection and measurement can be performed.

According to the present example, the same effects as in Example 1 can be obtained. Further, by using the electron beam reflection control electrode 601 having the Faraday cup as an electron beam irradiation switch, an optical axis of the electron beam irradiation switch 104 can be easily adjusted. Further, it is possible to suppress generation of secondary electrons or reflected electrons during non-irradiation.

EXAMPLE 4

Next, a fourth example of the present invention will be described. Matters described in Examples 1 to 3 and not described in the present example can also be applied to the present example unless there are special circumstances.

In the present example, to reduce the influence of secondary electrons or reflected electrons generated from an electron beam reflection control electrode under a condition of non-irradiation of an electron beam on a sample, the configuration in Example 1, that is, a surface of the electron beam reflection control electrode 201 illustrated in FIGS. 2A and 2B is processed.

Figure 7:
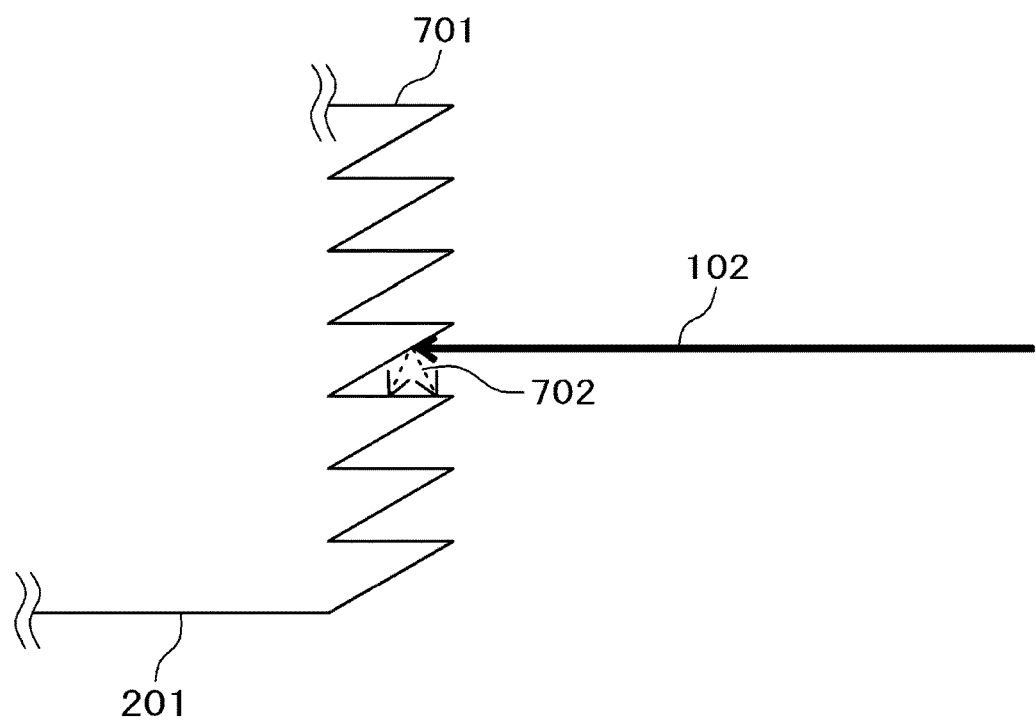
FIG. 7 is an enlarged cross-sectional view indicating an example of a surface of an electron beam reflection control electrode in an electron beam irradiation switch of an electron beam observation apparatus according to a fourth example.

FIG. 7 is an enlarged cross-sectional view indicating an example of the surface of the electron beam reflection control electrode 201 illustrated in FIG. 2B in the case of the non-irradiation of an electron beam to a sample. A serrated structure 701 is formed on the surface of the electron beam reflection control electrode 201. As illustrated in FIG. 2B, an electron beam 102 collides with the electron beam reflection control electrode 201, and secondary electrons or reflected electrons 702 generated at that time are scattered by the serrated surface structure 701, and absorbed in adjacent saw tooth. As a result, the secondary electrons or reflected electrons do not travel in a direction of a sample 109 and does not irradiate, and therefore noise is suppressed.

A serrated structure is described in the present example as a structure of the electron beam reflection control electrode 201. However, as long as a surface is not flat, and generated secondary electrons or reflected electrons can be confined, for example, the structure may be a rectangular tooth shape or a fractal shape. In the present example, the surface shape of the electron beam reflection control electrode 201 according to Example 1 is indicated as a representative example. However, the shape may be any of the shapes in Examples 1 to 3.

In the present example, an example is described in which an electrode surface is directly processed. However, a structure in which the generated secondary electrons or reflected electrons are confined by applying carbon or the like on the electrode surface may be formed.

As an electron beam reflection control electrode in the electron beam irradiation switch of the electron beam observation apparatus illustrated in FIG. 1, when a pulse having a pulse width of nanosecond to picosecond is formed as a primary electron beam by using the electron beam irradiation switch illustrated in FIGS. 7 and irradiates a sample, the influence of charging is reduced, deviation of an irradiation position of the primary electron beam on the sample is suppressed or prevented, and consequently highly sensitive and highly efficient inspection and measurement can be performed.

According to the present example, the same effects as in Example 1 can be obtained. Further, by forming a structure in which secondary electrons or reflected electrons are confined on a surface of the electron beam irradiation switch on which an electron beam enters, the secondary electrons or reflected electrons irradiated on the sample during non-irradiation are suppressed, and noise is reduced.

Although the examples have been described above, the present invention includes the following embodiments.

(1) A charged particle beam apparatus for irradiating a sample with a charged particle beam generated from a charged particle source includes a beam separator, a switch, and a control device. The beam separator switches a deflection direction according to a traveling direction of the charged particle beam. The switch includes at least one electrode. The control device controls the switch. The control device controls such that the switch is switched so as to perform a first condition in which a first voltage is applied to the electrode and a second condition in which a second voltage is applied to the electrode. In the first condition, the switch reverses a traveling direction of an orbit of the charged particle beam, and the charged particle beam reaches the sample. In the second condition, the switch absorbs the charged particle beam, and the charged particle beam does not reach the sample.

(2) The charged particle beam apparatus includes an electrode for absorbing and reversing a charged particle beam from a charged particle source by switching an applied voltage. By switching the applied voltage of the electrode, irradiation of the charged particle beam on the sample is switched. The present invention is not limited to the above-described example and includes various variations. For example, the above-described examples describe the present invention in detail for clarification, and every configuration described above may not be necessarily included. Further, configurations of the examples can be partially replaced with configurations of the other examples. Furthermore, a configuration of each example can be added to configurations of the other examples. Further, a part of a configuration of each example can be added to, deleted from, and replaced from other configurations.

The present invention is useful as a charged particle beam apparatus, in particular, as a highly sensitive and highly efficient observation, inspection and measurement technique using a charged particle beam.

What is claimed is:

1. A charged particle beam apparatus, comprising:
   a charged particle source;
   a stage on which a sample is placed;
   a charged particle optical system configured to irradiate the sample with a charged particle beam generated in the charged particle source;
   a separator which is inserted in the charged particle optical system and deflects a traveling direction of the charged particle beam out of an optical axis of the charged particle optical system or deflects the traveling direction in the optical axis of the charged particle optical system;
   a charged particle beam irradiation switch configured to absorb the charged particle beam deflected out of the optical axis of the charged particle optical system or reflect the charged particle beam toward the separator, and
   a control device configured to control the charged particle beam irradiation switch.

2. The charged particle beam apparatus according to claim 1,
   wherein, the charged particle beam irradiation switch has a charged particle beam reflection control electrode, and
   when a voltage such that velocity energy of the charged particle beam traveling in a direction of the charged particle beam reflection control electrode becomes zero is denoted by $|V_0|$, the control device controls reflection or absorption of the charged particle beam in the charged particle beam irradiation switch by applying a voltage $|V_{on}|$ which is higher than the voltage $|V_0|$ or a voltage $|V_{off}|$ lower than the voltage $|V_0|$ to the charged particle beam reflection control electrode.

3. The charged particle beam apparatus according to claim 2,
wherein a difference $\Delta V$ between the high voltage $|V_{on}|$ and the low voltage $|V_{off}|$ is represented by $\Delta V \leq 500$ V.

4. The charged particle beam apparatus according to claim 1,
wherein the charged particle beam irradiation switch comprises:
a charged particle beam reflection control electrode having an opening through which the charged particle beam absorbed by the charged particle beam irradiation switch passes, and
a detector configured to detect the charged particle beam having passed through the opening.

5. The charged particle beam apparatus according to claim 1,
wherein the charged particle beam irradiation switch has a charged particle beam reflection control electrode having a Faraday cup structure.

6. The charged particle beam apparatus according to claim 1,
wherein the charged particle beam irradiation switch includes a charged particle beam reflection control electrode having a surface structure for suppressing secondary charged particles or reflected charged particles.

7. The charged particle beam apparatus according to claim 1,
wherein the surface structure is a serrated surface structure.

8. The charged particle beam apparatus according to claim 1,
wherein the control device controls a time length $t_{off}$ of reflection and a time length $t_{on}$ of absorption in the charged particle beam irradiation switch, to suppress charging attributed to irradiation of the charged particle beam to the sample.

9. The charged particle beam apparatus according to claim 8,
wherein the control device controls the charged particle beam irradiation switch so as to repeat, as one cycle, a period including the time length $t_{off}$ of the reflection and the time length $t_{on}$ of the absorption of the charged particle beam in the charged particle beam irradiation switch.

10. The charged particle beam apparatus according to claim 9,
wherein a timing to switch either of reflection or absorption in the charged particle beam irradiation switch is determined by either of an optical condition of the charged particle optical system or a type of a material included in the sample, and
the optical condition includes at least one of an accelerating voltage for the charged particle beam, a probe current, a scanning speed, an electric field intensity directly above the sample, and an observation magnification.

11. The charged particle beam apparatus according to claim 8,
wherein the control device controls the charged particle beam irradiation switch so as to repeat, as one cycle, a period including a time length $t_{off1}$ of first reflection and a time length $t_{on1}$ of first absorption and a time length $t_{off2}$ of second reflection and a time length $t_{on2}$ of second absorption of the charged particle beam in the charged particle beam irradiation switch.

12. The charged particle beam apparatus according to claim 11,
wherein a timing to switch one of the first reflection, the first absorption, the second reflection, and the second absorption in the charged particle beam irradiation switch is determined by either of an optical condition of the charged particle optical system or a type of a material included in the sample, and
the optical condition includes at least one of an accelerating voltage for the charged particle beam, a probe current, a scanning speed, an electric field intensity directly above the sample, and an observation magnification.

13. The charged particle beam apparatus according to claim 1,
wherein the charged particle beam irradiation switch includes a charged particle beam reflection control electrode, and
one of crossovers formed by the charged particle beam is formed near the charged particle beam reflection control electrode.

14. A charged particle beam apparatus, comprising:
a charged particle source; and
a charged particle beam reflection control electrode configured to absorb and reflect charged particle beam from the charged particle source by switching an applied voltage and configured to switch irradiation of the charged particle beam on the sample.

* * * * *